(12) United States Patent
Berrian

(10) Patent No.: US 6,661,016 B2
(45) Date of Patent: Dec. 9, 2003

(54) ION IMPLANTATION UNIFORMITY CORRECTION USING BEAM CURRENT CONTROL

(75) Inventor: Donald W. Berrian, Topsfield, MA (US)

(73) Assignee: Proteros, LLC, Danver, MA (US)

( * ) Notice: Subject to any disclaimer, the term of this patent is extended or adjusted under 35 U.S.C. 154(b) by 251 days.

(21) Appl. No.: 09/887,808

(22) Filed: Jun. 22, 2001

(65) Prior Publication Data

US 2001/0054698 A1 Dec. 27, 2001

Related U.S. Application Data

(60) Provisional application No. 60/213,305, filed on Jun. 22, 2000.

(51) Int. Cl.⁷ ................................................. H01J 37/08
(52) U.S. Cl. .................................................. 250/492.21
(58) Field of Search ........................ 250/492.21, 492.2, 250/492.3

(56) References Cited

U.S. PATENT DOCUMENTS

| | | | |
|---|---|---|---|
| 2,053,537 A | 9/1936 | Schlesinger | |
| 2,108,091 A | 2/1938 | Ardenne | |
| 2,260,725 A | 10/1941 | Richards et al. | |
| 2,777,958 A | 1/1957 | Poole | |

(List continued on next page.)

FOREIGN PATENT DOCUMENTS

| | | |
|---|---|---|
| DE | 1190226 | 4/1965 |
| JP | 5923024 | 2/1984 |
| JP | 6288246 | 4/1987 |
| WO | 8802920 | 4/1988 |

*Primary Examiner*—Judy Nguyen
(74) *Attorney, Agent, or Firm*—Curtis A. Vock; Lathrop & Gage L.C.

(57) ABSTRACT

The invention provides uniform ion dose at the wafer position by varying the current of the ion beam synchronously with the scan. The beam is scanned by a linear scan, and beam scan position information is sent from the beam scan electronics to the beam control circuit connected with the ion source; this information transfer preferably occurs over a fiber optic link to cross the high voltage between the two sets of electronics. At initiation, the beam current is held constant and a Faraday cup is scanned across the beam to measure the variation of dose with scan position. A beam versus scan position waveform is calculated to correct the variation in dose; and the waveform is then loaded into a memory in the ion beam control circuit. The ion beam control circuit then varies the output of the ion source synchronously with the scan to adjust the dose as a function of scan position, as determined by the waveform. If necessary, repeated measurements and waveform calculations can be made until the dose is uniform.

17 Claims, 2 Drawing Sheets

U.S. PATENT DOCUMENTS

| | | |
|---|---|---|
| 3,122,631 A | 2/1964 | Geerk et al. |
| 3,193,717 A | 7/1965 | Nunan |
| 3,569,757 A | 3/1971 | Brewer |
| 3,689,766 A | 9/1972 | Freeman |
| 3,778,626 A | 12/1973 | Robertson |
| 3,816,748 A | 6/1974 | Harrison |
| 3,911,321 A | 10/1975 | Wardly |
| 4,017,403 A | 4/1977 | Freeman |
| 4,021,675 A | 5/1977 | Shifrin |
| 4,063,098 A | 12/1977 | Enge |
| 4,066,895 A | 1/1978 | Iwanaga |
| 4,117,339 A | 9/1978 | Wolfe |
| 4,140,913 A | 2/1979 | Anger et al. |
| 4,260,893 A | 4/1981 | Bakker et al. |
| 4,260,897 A | 4/1981 | Bakker et al. |
| 4,276,477 A | 6/1981 | Enge |
| 4,283,631 A | 8/1981 | Turner |
| 4,367,411 A | 1/1983 | Hanley et al. |
| 4,421,988 A | 12/1983 | Robertson et al. |
| 4,433,247 A | 2/1984 | Turner |
| 4,447,773 A | 5/1984 | Aston |
| 4,449,051 A | 5/1984 | Berkowitz |
| 4,469,948 A | 9/1984 | Veneklasen et al. |
| 4,476,393 A | 10/1984 | Taya et al. |
| 4,494,005 A | 1/1985 | Shibata et al. |
| 4,564,763 A | 1/1986 | Bruel et al. |
| 4,578,589 A | 3/1986 | Aitken |
| 4,587,432 A | 5/1986 | Aitken |
| 4,587,433 A | 5/1986 | Farley |
| 4,633,138 A | 12/1986 | Tokiguchi et al. |
| 4,661,712 A | 4/1987 | Mobley |
| 4,687,936 A | 8/1987 | McIntyre et al. |
| 4,745,281 A | 5/1988 | Enge |
| 4,804,852 A | 2/1989 | Rose et al. |
| 4,806,766 A | 2/1989 | Chisholm |
| 4,922,106 A | 5/1990 | Berrian et al. |
| 4,980,562 A | 12/1990 | Berrian et al. |
| 5,012,104 A | 4/1991 | Young |
| 5,053,627 A | 10/1991 | Ruffell et al. |
| 5,132,544 A | 7/1992 | Glavish |
| 5,311,028 A | 5/1994 | Glavish |
| 5,481,116 A | 1/1996 | Glavish et al. |

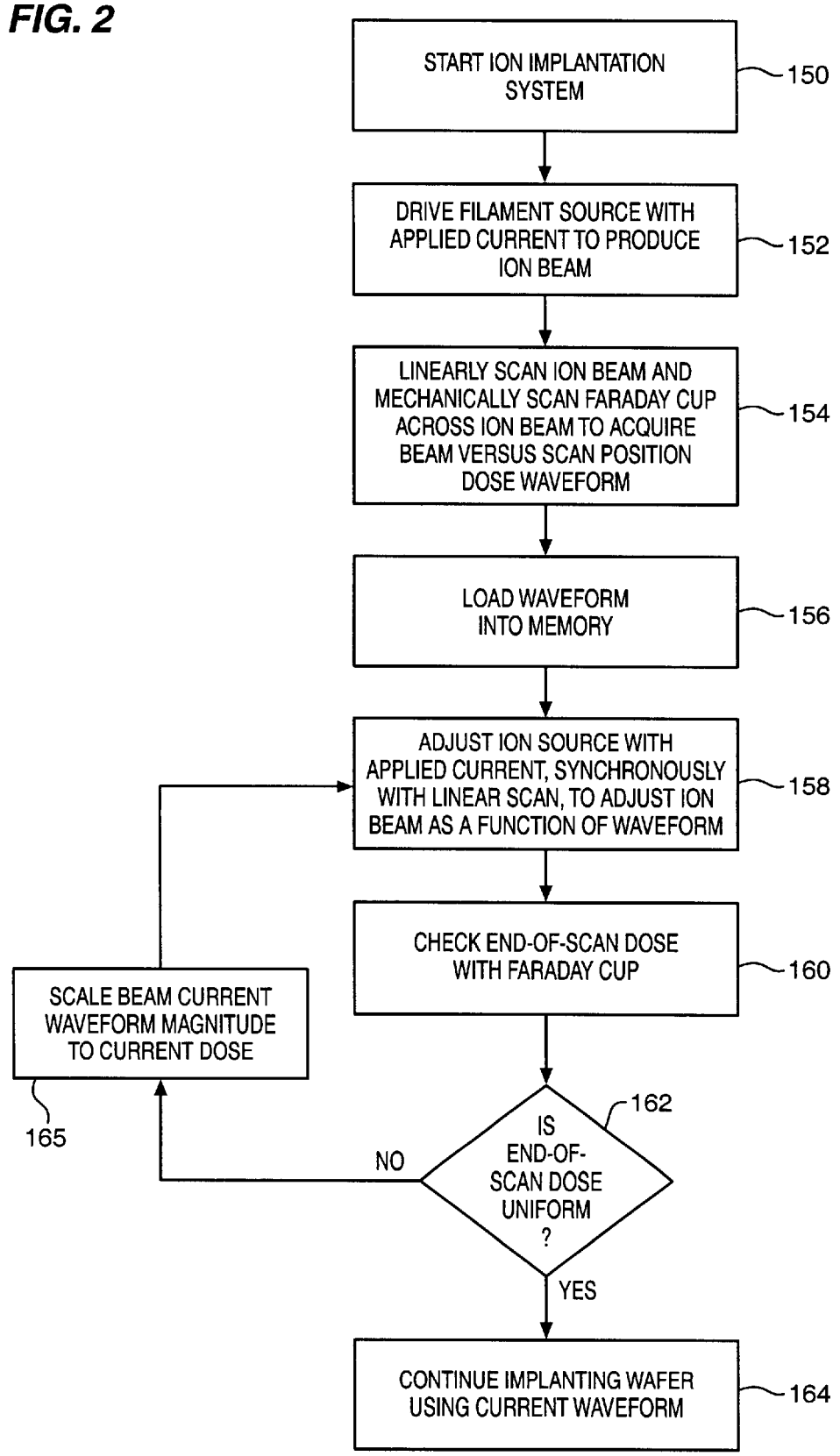

ION IMPLANTATION UNIFORMITY CORRECTION USING BEAM CURRENT CONTROL

RELATED APPLICATIONS

This application claims priority to U.S. Provisional Application No. 60/213,305, filed on Jun. 22, 2000; U.S. Provisional Application No. 60/213,305 is expressly incorporated herein by reference.

BACKGROUND OF THE INVENTION

To better understand the invention, U.S. Pat. Nos. 5,481,116, 4,980,562 and 4,922,106 are incorporated herein by reference as background.

The steady increase of wafer size within the semiconductor industry has resulted in ion implanters using relatively high scan angles to cover the wafer. Undesirably, high scan angles tend to cause dose non-uniformities. Dose non-uniformities also increase due to processing efficiencies and plasma and system peculiarities that occur during operation.

At the same time, industry demands for ion dose uniformity make it desirable to reduce or eliminate dose non-uniformities. The prior art has attempted to address these issues. In U.S. Pat. No. 5,481,116, for example, an elaborate scanning magnet system is described to reduce a 0.5% drop in beam current at the center of the scan. The '116 patent also describes the use of fourth order polynomials in the magnet pole shapes, presumably to obtain a scan with uniform dose and uniform implant angle. The '116 patent attempts to achieve precise uniformity without feedback control, which is difficult, expensive, and ultimately insufficient if system operation is not correctly predicted.

In U.S. Pat. No. 4,922,106, a system is described for correcting non-uniformities in dose by measuring the beam at the wafer plane and adjusting the scan pattern to obtain a uniform dose. The teachings of the '106 patent thus require a degree of control over the scan that are difficult to achieve when magnets are used for scanning. The '106 patent also suffers from a limited dynamic range: reducing the dose at a point requires scanning the beam faster and faster without practical limits as to how fast a capacitive or inductive load may be driven. These problems are exacerbated when the ion implantation system uses a small beam current to fill a wafer area that was slightly under-dosed in a prior mechanical scan.

It is, accordingly, one object of the invention to provide an ion beam scanning system and method that reduce or eliminate the afore-mentioned problems. Other objects of the invention include utilizing beam current control during one axis of the electrical scan. Still other objects of the invention are apparent within the description which follows.

SUMMARY OF THE INVENTION

In one aspect, the invention provides uniform ion dose at the wafer position by varying the current of the ion beam synchronously with the scan. In the preferred aspect, the beam is scanned by a linear scan, but beam scan position information is sent from the beam scan electronics to the beam control circuit connected with the ion source; this information transfer preferably occurs over a fiber optic link to cross the high voltage between the two sets of electronics. Preferably, at initiation, the beam current is held constant and a Faraday cup is scanned across the beam to measure the variation of dose with scan position. A beam versus scan position waveform is calculated to correct the variation in dose; and the waveform is then loaded into a memory in the ion beam control circuit. The ion beam control circuit then varies the output of the ion source synchronously with the scan to adjust the dose as a function of scan position, as determined by the waveform. If necessary, repeated measurements and waveform calculations can be made until the dose is uniform.

Accordingly, in the preferred operation of the invention, the ion beam is controlled by a mirror electrode that adjusts the arc current at high speeds on the order of 0.05–0.1 MHz. Such speeds are 10–50 times larger than the scan speeds of about 1 ms per scan. Accordingly, the invention provides fine adjustment of beam current during the scan to achieve dose uniformity throughout the scan. Alternatively, in another aspect, the arc current is adjusted by another technique such as modulating the arc voltage.

In addition to obtaining a uniform dose along the electronic scan axis, in another aspect, feedback from a Faraday cup is used during implantation to vary the ion source current. This feedback is used to correct variations in beam current at the wafer produced by photoresist outgassing or other effects that in turn cause the beam transport or wafer or ion source efficiency to vary during an implant.

In one aspect, the invention provides a method of uniformly implanting a wafer with an ion beam, including the steps of: generating an ion beam from an ion source; determining a first ion dose versus scan position for the ion beam scanned across a target location; and adjusting source current according to the first ion dose versus scan position to adjust the ion dose when the ion beam is scanned across the target location, and as a function of scan position, such that a substantially uniform ion dose is generated at the target location.

In another aspect, the method can include the further step of positioning a wafer at the target location, and ion implanting the wafer with a substantially uniform dose of ions while the ion beam is scanned across the target location.

In a preferred aspect, the step of determining ion dose versus scan position utilizes a Faraday cup scanned approximately across the target location.

In still another aspect, the first ion dose versus scan position is formed and loaded as a waveform into memory; the waveform is then used in adjusting source current so as to provide the substantially uniform dose.

Preferably, an arc current controller is used to adjust the ion source current.

In another aspect, the method includes the further steps of measuring end of scan ion dose, and varying a magnitude of the dose versus scan position to further reduce dose non-uniformities.

In yet another aspect, the invention provides a system for producing a substantially uniform ion dose on a wafer. An ion source, driven by applied current, is used to generate an ion beam. An ion scanner is used to deflect the beam along a scan direction and across the wafer. An ion detector is used to sense current density of the ion beam scanned across the wafer. A controller is used in feedback with the ion scanner to adjust the applied current as a function of information characterizing the position of the ion scanner to achieve substantially uniform ion dose across the wafer.

Preferably, the system includes solid-state memory coupled to the controller to store an ion dose versus scan position waveform. In one aspect, at each scan, or periodically, the controller and detector cooperate to scale the waveform to ensure the substantially uniform dose; in this aspect the detector is used to measure ion does at the "end of scan" at a location adjacent to the target wafer. In one specific aspect, the detector is a Faraday cup.

The invention is next described further in connection with preferred embodiments, and it will become apparent that various additions, subtractions, and modifications can be made by those skilled in the art without departing from the scope of the invention.

BRIEF DESCRIPTION OF THE DRAWINGS

A more complete understanding of the invention may be obtained by reference to the drawings, in which:

FIG. 2 illustrates a process flow for controlling ion beam current to obtain uniform dosage at a wafer in accord with the invention.

DETAILED DESCRIPTION OF THE DRAWINGS

Figure 1:
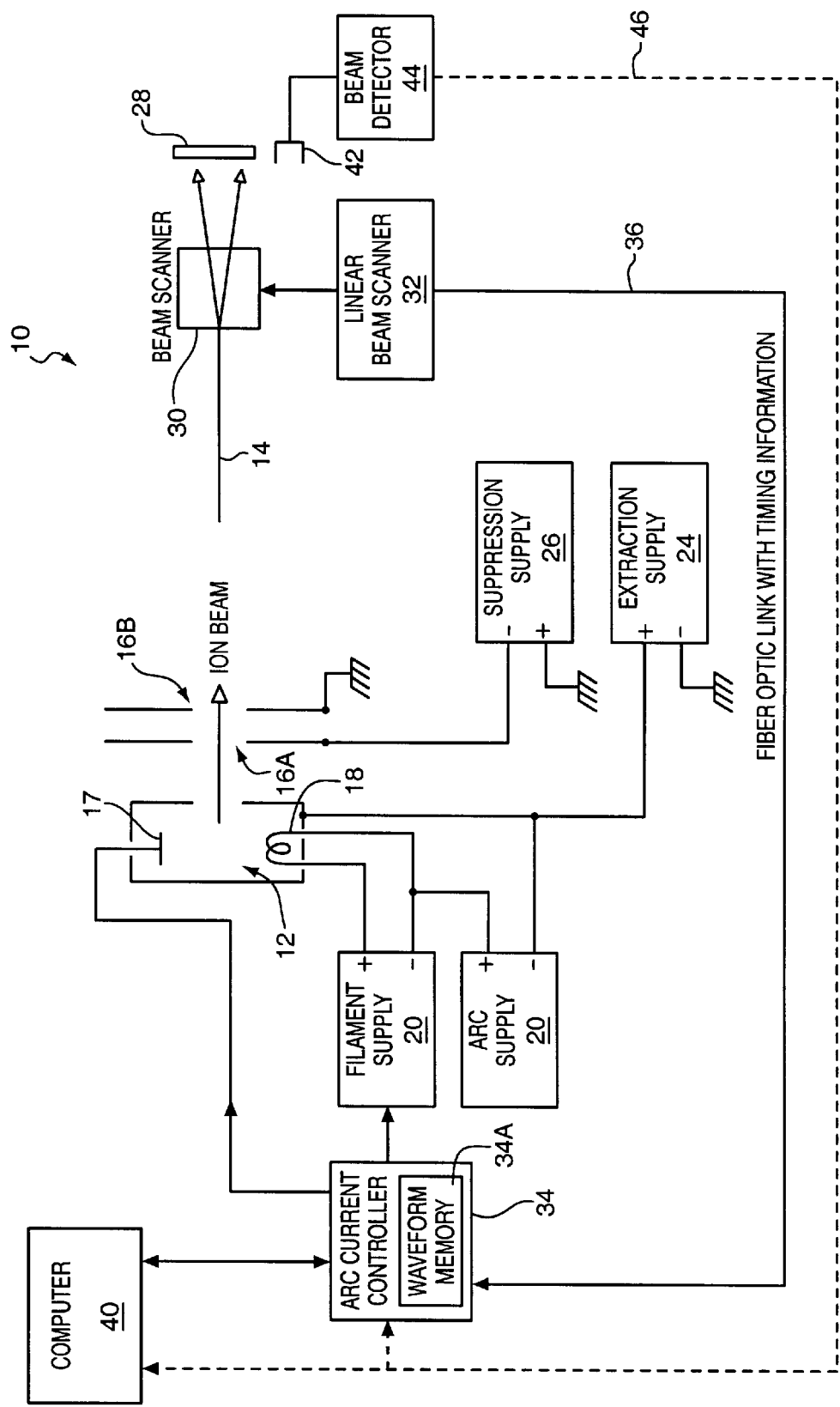
FIG. 1 shows an ion implanation system for correcting ion beam dose uniformity during ion implantation, in accord with the invention.

FIG. 1 shows a schematic illustration of an ion implantation system 10 constructed according to the invention. System 10 shows an ion source 12 for generating an ion beam 14 through apertures 16A, 16B. Source 12 includes a source filament 18 that generates ions for beam 14. Filament 18 is driven by filament power supply 20 and arc power supply 22, as shown. In cooperation with arc supply 22, an extraction power supply 24 also connects to source 12 to draw the ions from source 12 for use in beam 14, as shown. Optionally, a suppression power supply 26 operates to suppress spurious ions at aperture 16A. A mirror electrode 17, within source 12, functions to repel speeding electrons from filament 18 to obtain ion efficiency in source 12.

In operation, beam 14 is linearly scanned across a wafer 28 by an electrical beam scanner 30. Scanner 30 is controlled by scanner controller 32 so as to provide scan timing of about 1 ms per scan across wafer 28. A mechanical scan (not shown) is also preferably done by mechanical movement of wafer 28 in an axis perpendicular to the electrical scan shown in FIG. 1. Controller 32 connects to arc current controller 34 via a fiber optic link 36 and also provides real-time scan position (and/or, alternatively, timing or scan waveform information) to controller 34. Filament supply 20 optionally keeps source control circuitry (not shown) within its line-to-line response limits.

During scan, and as a function of the scan position, controller 34 controls current to source 12 to achieve a desired beam current waveform onto wafer 28. As the electrical scan across wafer 28 occurs in about 1 ms, controller 34 adjusts source current 10–50 times faster, e.g., at rates of up to 0.2 MHz. Preferably, controller 34 includes internal memory 34A to store a desired waveform pattern. Controller 34 also preferably connects to computer 40 for user input and overall control of system 10.

In the preferred embodiment of the invention, system 10 includes a Faraday cup 42 used to measure ion beam density. As a matter of design choice, cup 42 may connect to beam detection electronics 44 and computer 40, via communication link 46, to track and monitor beam current density for use in setting commands to controller 34. Cup 42 is first used to take measurements with wafer 28 removed from the process and in determining dose correction waveforms at the wafer target location. Specifically, cup 42 is moved by robotics (not shown) at the wafer location to obtain the waveform data. Cup 42 is thereafter used during implantation, in conjunction with controller 42, to vary the entire waveform based on end of scan measurements. That is, at an approximate position shown in FIG. 1, cup 42 receives a dose of ions from beam 14 at every scan; this dosage data is relayed to controller 34, along line 46, to scale the waveform up or down to remove remaining dose non-uniformities.

More particularly, beam 14 is electrically scanned by beam scanner electrode 30 under control of scanner controller 32. Controller 32 sends position information to arc current controller 34 using optical link 36 to cross the high voltage that exists between electronics 34 and 32. Initially, beam current is held constant as Faraday cup 42 scans across beam 14 to measure variation of dose with scan position. A beam versus scan position waveform is then calculated (e.g., at computer 40) to correct the variation in dose; that waveform is loaded into memory 34A of controller 34. Controller 34 thereafter varies the output of source 12 synchronously with the scan of scanner 30 to adjust ion dose as a function of scan position on wafer 28. Repeated end of scan measurements are made through cup 42 to shift the waveform due to any drifting during implantation. End of scan measurements may be done at each scan or periodically.

As needed, repeated measurements and calculations via cup 42 and computer 40 can be made to acquire new waveforms for subsequent implantations. Those skilled in the art should appreciate that "scan position", as used herein, may be represented by timing information, scan waveform information, or other data, in addition to actual scan position. Accordingly, as used herein "scan position" means timing, waveform or scan position information.

In summary, the scan of beam 14 is set by operation of controller 34, which acts on mirror electrode 17 adjusting the electron current from filament 18 at high speed (e.g., up to 0.2 MHz). In the prior art, current control was set to adjust filament temperature—and hence electron emission—which is not fast enough for desired scan frequencies.

FIG. 2 shows a process flow chart for obtaining uniform ion beam dosage in accord with the invention. The process starts at step 150. An ion beam is next generated at step 152. The ion beam is electronically scanned, while a Faraday cup is mechanically scanned across the ion beam, to acquire a beam versus scan position dose waveform needed to achieve uniformity, at step 154. The waveform is stored into memory at step 156. During implantation on a wafer, source arc current is varied during the scan and as a function of scan position based on the stored waveform, at step 158, to correct dose non-uniformities. Ten to fifty adjustments to source current are typically made during one scan across the wafer. End of scan dosage is checked at step 160 by a Faraday cup adjacent to the wafer at the end of scan. If the end of scan dose is the same, step 162, no further adjustments are needed and continued implantation of wafers may proceed, at step 164. If the end of scan dose is not correct, step 162—indicating that additional adjustment is required to make scan uniformity—the waveform is scaled up or down so as to adjust the dosage at the next scan, at step 165; and processing continues at step 154.

The invention thus attains the objects set forth above, among those apparent from the preceding description. Since certain changes may be made in the above methods and systems without departing from the scope of the invention, it is intended that all matter contained in the above description or shown in the accompanying drawing be interpreted as illustrative and not in a limiting sense. It is also to be understood that the following claims are to cover all generic and specific features of the invention described herein, and all statements of the scope of the invention which, as a matter of language, might be said to fall there between.

Having described the invention, what is claimed is:

1. A method of uniformly implanting a wafer with an ion beam, comprising the steps of: generating an ion beam from an ion source; determining a first ion dose versus scan position for the ion beam scanned across a target location; and adjusting source current according to the first ion dose versus scan position to adjust the ion dose when the ion beam is scanned across the target location, and as a function of the scan position, wherein a substantially uniform ion dose is generated at the target location.

2. A method of claim 1, further comprising positioning a wafer at the target location, and ion implanting the wafer with a substantially uniform dose of ions while the ion beam is scanned across the target location.

3. A method of claim 2, comprising the further steps, after the step of ion implanting the wafer, of determining a second ion dose versus scan position for the ion beam scanned across the target location and adjusting the source current according to the second ion dose versus scan position to adjust the ion dose when the ion beam is scanned across the target location, and as a function of the scan position, wherein a substantially uniform ion dose is generated at the target location.

4. A method of claim 1, wherein the step of determining ion dose versus scan position comprises utilizing a Faraday cup scanned approximately across the target location.

5. A method of claim 1, further comprising the steps of loading the first ion dose versus scan position as a waveform into memory, and utilizing the waveform in the step of adjusting source current so as to provide the substantially uniform dose.

6. A method of claim 1, wherein the step of adjusting source current comprises utilizing an arc current controller connected to the ion source.

7. A method of claim 6, further comprising the step of scanning the ion beam across the target location by a beam scanner.

8. A method of claim 7, wherein the step of adjusting source current comprises the step of feeding back one of scan position or scan timing information from the beam scanner to the arc controller.

9. A method of claim 8, wherein the step of feeding back scan position or scan timing information comprises utilizing a fiber optic link.

10. A method of claim 1, wherein the step of adjusting the current comprises adjusting the current at a rate of at least about 10 times faster than a time duration for the ion beam scanned across a target location.

11. A method of claim 1, further comprising the steps of measuring end of scan ion dose, and varying a magnitude of the dose versus scan position to further reduce dose non-uniformities.

12. A system for producing a substantially uniform ion dose on a wafer, comprising:

an ion source, driven by applied current, for generating an ion beam;

an ion scanner for deflecting the beam along a scan direction and across the wafer;

an ion detector for sensing current density of the ion beam scanned across the wafer; and a controller, in feedback with the ion scanner, for adjusting the applied current as a function of information characterizing the position of the ion scanner to achieve substantially uniform ion dose across the wafer.

13. A system of claim 12, further comprising solid-state memory coupled to the controller for storing an ion dose versus scan position waveform.

14. A system of claim 12, the controller, detector and memory cooperating to update a waveform magnitude to ensure the substantially uniform dose.

15. A system of claim 12, further comprising a computer coupled with the controller to command the update of the waveform.

16. A system of claim 12, further comprising a computer coupled with the controller for providing user inputs and control of the system.

17. A system of claim 12, wherein the ion detector comprises a Faraday cup.

* * * * *